(12) United States Patent
Yamanishi et al.

(10) Patent No.: US 7,843,981 B2
(45) Date of Patent: Nov. 30, 2010

(54) QUANTUM CASCADE LASER

(75) Inventors: Masamichi Yamanishi, Hamamatsu (JP); Tadataka Edamura, Hamamatsu (JP); Naota Akikusa, Hamamatsu (JP); Kazuue Fujita, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 11/896,115

(22) Filed: Aug. 29, 2007

(65) Prior Publication Data

US 2008/0219308 A1 Sep. 11, 2008

(30) Foreign Application Priority Data

Aug. 31, 2006 (JP) .............................. P2006-236491

(51) Int. Cl.
*H01S 5/00* (2006.01)
(52) U.S. Cl. ............... 372/45.01; 372/44.01; 372/43.01
(58) Field of Classification Search .............. 372/45.01, 372/44.01, 43.01
See application file for complete search history.

(56) References Cited

U.S. PATENT DOCUMENTS

| | | | | |
|---|---|---|---|---|
| 5,457,709 A | * | 10/1995 | Capasso et al. | 372/45.01 |
| 5,509,025 A | | 4/1996 | Capasso et al. | 372/45 |
| 5,588,015 A | * | 12/1996 | Yang | 372/45.012 |
| 6,324,199 B1 | * | 11/2001 | Capasso et al. | 372/45.01 |
| 2004/0161009 A1 | * | 8/2004 | Edamura et al. | 372/45 |

FOREIGN PATENT DOCUMENTS

| | | |
|---|---|---|
| JP | 8-279647 | 10/1996 |
| JP | 2004-119814 | 4/2004 |
| JP | 2006-32691 | 2/2006 |

OTHER PUBLICATIONS

R. Kohler et al., Terahertz Semiconductor-heterostructure Laser; *Nature*, vol. 417, 2002, pp. 156-159.
Williams et al., "Terahertz Quantum-Cascade Laser at $\lambda \approx 100$ μm using metal waveguide for mode confinement"; *Applied Physics Letters*, vol. 83, 2003, pp. 2124-2126.

* cited by examiner

*Primary Examiner*—Minsun Harvey
*Assistant Examiner*—Kinam Park
(74) *Attorney, Agent, or Firm*—Drinker Biddle & Reath LLP

(57) ABSTRACT

A quantum cascade laser is composed of a semiconductor substrate, and an active layer provided on the semiconductor substrate and having a cascade structure formed by multi-stage-laminating unit laminate structures 16 each of which includes a quantum well light emitting layer 17 and an injection layer 18. The unit laminate structure 16 has, in its sub-band level structure, an emission upper level 3, an emission lower level 2, and an injection level 4 as an energy level higher than the emission upper level 3, and light hv is generated by means of intersubband transition of electrons from the level 3 to the level 2 in the light emitting layer 17, and electrons through the intersubband transition are injected into the injection level in a unit laminate structure of the subsequent stage via the injection layer 18, and from this injection level, electrons are supplied to the emission upper level. Thereby, a quantum cascade laser which realizes operation with a high output at a high temperature is realized.

5 Claims, 9 Drawing Sheets

QUANTUM CASCADE LASER

BACKGROUND OF THE INVENTION

1. Field of the Invention

The present invention relates to a quantum cascade laser using intersubband transition in a quantum well structure.

2. Related Background Art

Light in a mid-infrared wavelength range (for example, wavelength of 5 to 30 μm) is an important wavelength range in the field of spectroanalysis. As a high-performance semiconductor light source in this wavelength range, recently, a quantum cascade laser (QCL) has gained attention (regarding the quantum cascade laser, refer to, for example, Patent documents 1 to 5 and Non-patent documents 1 and 2 listed below).

The quantum cascade laser is a monopolar type laser element which generates light by means of electron transition between subbands by using a level structure formed by subbands in a semiconductor quantum well structure, and high efficiency and high output operation can be realized by multistage cascade coupling of quantum well light emitting layers that are formed by quantum well structures and become an active region. This cascade coupling of quantum well light emitting layers is realized by using an electron injection layer for injecting electrons into the emission upper level and alternately laminating quantum well light emitting layers and injection layers.

Patent document 1: Japanese Patent Application Laid-Open No. H08-279647

Patent document 2: Japanese Patent Application Laid-Open No. 2006-032691

Patent document 3: Japanese Patent Application Laid-Open No. 2004-119814

Patent document 4: US Patent Publication No. 5457709

Patent document 5: US Patent Publication No. 5509025

Non-patent document 1: R. Kohler et al., "Terahertz semiconductor-heterostructure laser," Nature Vol. 417 (2002) pp. 156-159

Non-patent document 2: Benjamin S. Williams et al., "Terahertz quantum-cascade laser at λ=100 μm using metal waveguide for mode confinement," Appl. Phys. Lett. Vol. 83 (2003) pp. 2124-2126

SUMMARY OF THE INVENTION

In the above-described quantum cascade laser, the emission wavelength has been actively lengthened since the success of the oscillation operation, and in 2002, laser emission in the terahertz (THz) region was reported (Non-patent document 1). The terahertz region is a far-infrared region of about 100 μm in terms of wavelength, and is a frequency region positioned at the boundary between radio waves and light waves. A terahertz wave (THz wave) has both transmission of radio waves and rectilinear propagation of light waves, so that its application as a new sensing means in various fields including, for example, biomedical, security, communications, and space observation, etc., have been considered.

In a semiconductor laser with a conventional structure, it is difficult to lengthen the wavelength to such a terahertz region. On the other hand, in a quantum cascade laser, it is possible to control the transition wavelength by the design of the quantum well structure in the active layer, and emission in the terahertz region has been realized. However, at present, the operation of the quantum cascade laser in the terahertz region is limited to the operation in an extremely low-temperature environment using liquid nitrogen, and its laser output is as low as 1 mW or less, so that its performance is not sufficient as a light source.

The present invention was made to solve the above-described problem, and an object thereof is to provide a quantum cascade laser capable of realizing operation with a high output at a high temperature.

Concerning the above-described problem, the inventors of the present invention performed a detailed examination on the subband level structure in the quantum cascade laser. As a result, it was found that in a quantum cascade laser with a conventional structure, for example, electrons from an injection layer of a preceding stage were injected not only into the emission upper level but also into the emission lower level in the cascade structure of the active layer, so that electron efficiency injection into the emission upper level is difficult, and this is one of the causes limiting the laser performance, and the present invention was conceived.

That is, the quantum cascade laser of the present invention is composed of (1) a semiconductor substrate; and (2) an active layer which is provided on the semiconductor substrate and has a cascade structure formed by alternately laminating quantum well light emitting layers and injection layers by multistage-laminating unit laminate structures each of which includes the quantum well light emitting layer and the injection layer, wherein (3) each of the plurality of unit laminate structures included in the active layer has an emission upper level, an emission lower level, and an injection level as an energy level higher than the emission upper level in its subband level structure, and (4) light is generated by intersubband transition of electrons from the emission upper level to the emission lower level in the quantum well light emitting layer, and electrons through the intersubband transition are injected into the injection level in the unit laminate structure of the subsequent stage via the injection layer.

In the above-described quantum cascade laser, in the subband level structure in the unit laminate structure formed of the quantum well light emitting layer and injection layer, in addition to the emission upper level and the emission lower level relating to emission, an injection level is provided as an energy level higher than the emission upper level. Then, electrons from the unit laminate structure of the preceding stage are not directly injected into the emission upper level, but are injected into the injection level and then relaxed and supplied to the emission upper level. Thereby, the supply efficiency of electrons to the emission upper level can be improved, and operation of the quantum cascade laser with a high output at a high temperature is realized. Such a subband level structure can be controlled by the design of the quantum well structure in the unit laminate structure constituting the active layer.

According to the quantum cascade laser of the present invention, in the subband level structure in the unit laminate structure constituting the active layer, in addition to the emission upper level and the emission lower level, an injection level higher than the emission upper level is provided, and electrons from the unit laminate structure of the preceding stage are injected into the injection level and then supplied to the emission upper level, whereby the supply efficiency of electrons to the emission upper level can be improved, and operation of the quantum cascade laser with a high output at a high temperature can be realized.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
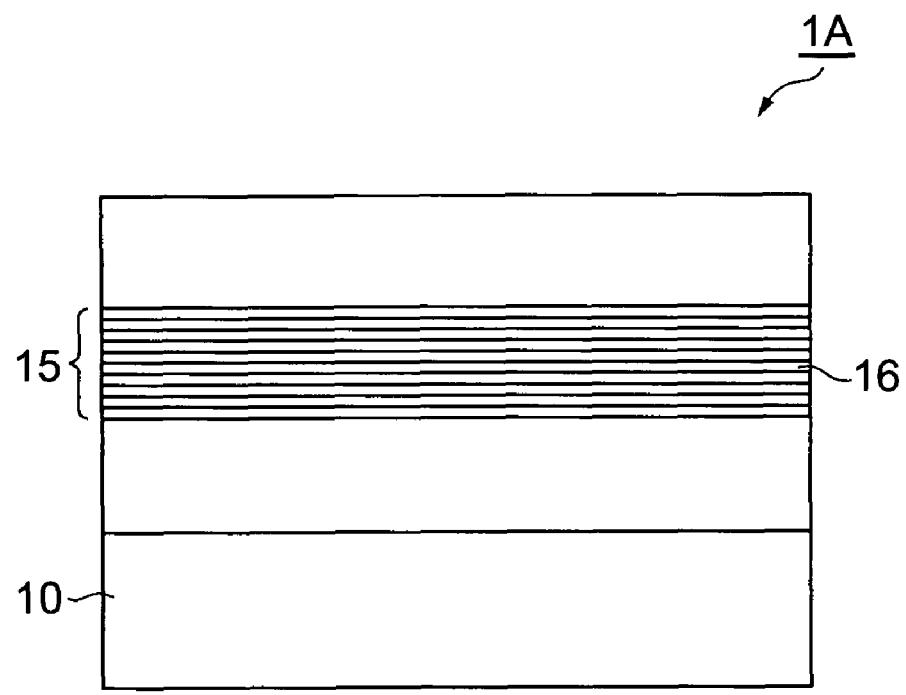
FIG. 1 is a view schematically showing a basic configuration of a quantum cascade laser.

Hereinafter, preferred embodiments of a quantum cascade laser of the present invention will be described in detail with reference to the drawings. In the description of the drawings, the same components are attached with the same reference numerals, and overlapping description will be omitted. The dimensional ratios of the drawings are not always equal to those of the description.

FIG. 1 is a view schematically showing a basic configuration of a quantum cascade laser of the present invention. The quantum cascade laser 1A of this embodiment is a monopolar type laser element which generates light by using electron transition between subbands in a semiconductor quantum well structure. This quantum cascade laser 1A is composed of a semiconductor substrate 10 and an active layer 15 formed on the semiconductor substrate 10. On two predetermined surfaces opposite to each other among side surfaces of the quantum cascade laser 1A, mirror surfaces (not shown) forming optical resonators are formed.

The active layer 15 has a cascade structure including quantum well light emitting layers to be used for generating light and injection layers to be used for injection of electrons into the light emitting layers, alternately multistage-laminated. In detail, a semiconductor laminated structure including a quantum well light emitting layer and an injection layer is defined as a unit laminate structure 16 of one period, and by laminating the unit laminate structures 16 in multistage, the active layer 15 having a cascade structure is formed. The number of laminations of the unit laminate structures 16 including the quantum well light emitting layers and the injection layers are properly set, and for example, are about several hundred. The active layer 15 is formed on the semiconductor substrate 10 directly or via another semiconductor layer.

Figure 2:
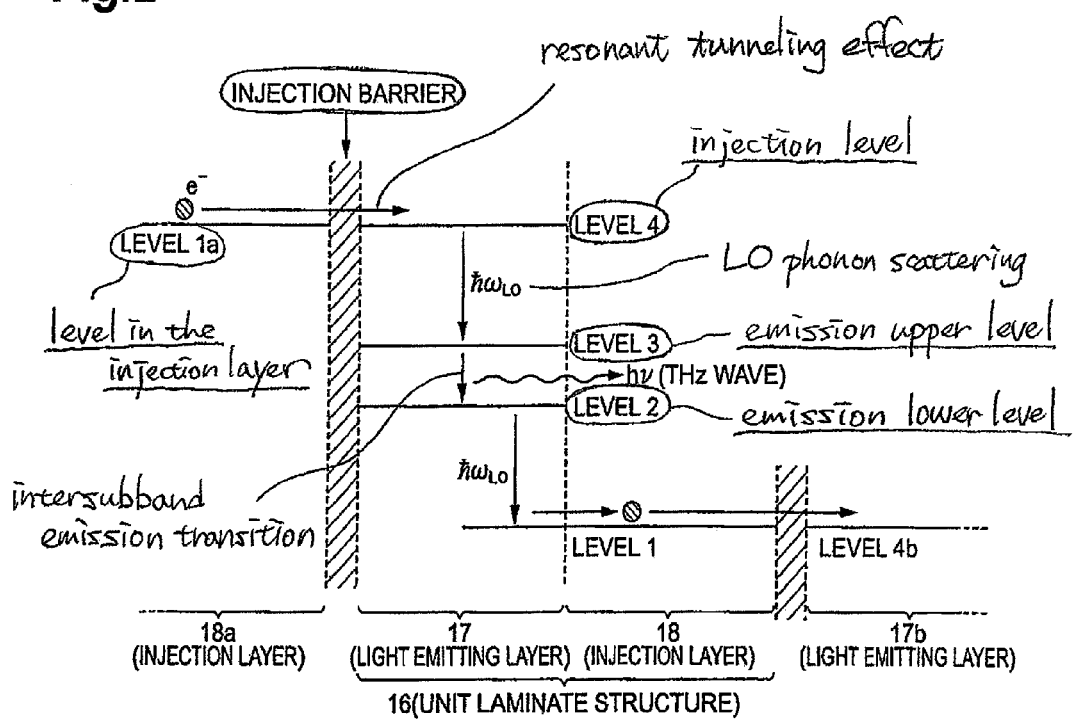
FIG. 2 is a diagram showing a subband level structure in an active layer of the quantum cascade laser shown in FIG. 1.

FIG. 2 is a diagram showing a subband level structure in the active layer of the quantum cascade laser shown in FIG. 1. As shown in FIG. 2, each of the plurality of unit laminate structures 16 included in the active layer 15 is composed of a quantum well light emitting layer 17 and an injection layer 18. The quantum well light emitting layer 17 and the injection layer 18 are formed so as to have a predetermined quantum well structure including a quantum well layer and a quantum barrier layer, respectively, as described later. Thereby, in the unit laminate structure 16, a subband level structure as an energy level structure according to a quantum well structure is formed.

As shown in FIG. 2, the unit laminate structure 16 constituting the active layer 15 in the quantum cascade laser 1A of this embodiment has, in addition to the emission upper level (level 3) and the emission lower level (level 2) relating to emission by means of intersubband transition, an injection level (level 4) as an energy level higher than the emission upper level 3 in the subband level structure. This injection level 4 is set so that an energy difference between the injection level 4 and the emission upper level 3 becomes energy of LO (Longitudinal Optical) phonons.

$$E_{LO} = \hbar \omega_{LO}$$

This energy $E_{LO}$ of LO phonons is $E_{LO}$=36 meV when assuming, for example, GaAs as a semiconductor material.

The unit laminate structure 16 shown in FIG. 2 has a relaxation level 1 as an energy level lower than the emission lower level 2 in the subband level structure. This relaxation level 1 is set so that an energy difference between the emission lower level 2 and the relaxation level 1 becomes energy $E_{LO}$ of LO phonons similar to the above-described injection level 4. In this case, in the subband level structure shown in FIG. 2, the energy interval between the level 4 and the level 3 and the energy interval between the level 2 and the level 1 are set to be equal to each other. The injection level 4 is set so as to substantially coincide with a predetermined level (for example, relaxation level) 1a in the injection layer 18a of a unit laminate structure of the preceding stage, when a set operation voltage is applied.

In this subband level structure, electrons e⁻ from the level 1a of the injection layer 18a of the preceding stage are injected into the injection level 4 of the quantum well light emitting layer 17 due to a resonant tunneling effect via an injection barrier. Electrons injected into the injection level 4 are supplied at a high speed to the emission upper level 3 by means of LO phonon scattering (longitudinal optical phonon scattering). Furthermore, electrons supplied to the emission upper level 3 emission-transit to the emission lower level 2, and at this time, light hν of a wavelength corresponding to the energy difference between subband levels of the level 3 and the level 2 (for example, THz wave) is generated.

The electrons that transited to the emission lower level 2 are relaxed at a high speed to the relaxation level 1 by means of LO phonon scattering. Thus, by pulling electrons at a high speed out of the emission lower level 2, the inverted population for realizing laser emission between the level 3 and level 2 is formed.

The electrons relaxed to the relaxation level 1 are injected in a cascading manner into the injection level 4b in the light emitting layer 17b of the unit laminate structure of the subsequent stage via the injection layer 18. These injection, relaxation, and emission transition of electrons are repeated for the plurality of unit laminate structures 16 constituting the active layer 15, whereby light generation occurs in a cascading manner in the active layer 15. That is, by alternately laminating a number of quantum well light emitting layers 17 and injection layers 18, the electrons successively move to the laminates 16 in a cascading manner, and light hv is generated at the time of intersubband transition in each laminate 16. Such light is resonated by the optical resonator of the laser 1A, whereby a laser beam with a predetermined wavelength is generated.

The effect of the quantum cascade laser 1A of this embodiment will be described.

In the quantum cascade laser 1A shown in FIG. 1 and FIG. 2, in the subband level structure of the unit laminate structure 16 composed of the quantum well light emitting layer 17 and the injection layer 18, in addition to the emission upper level 3 and the emission lower level 2 relating to emission, an injection level 4 is provided as an energy level higher than the emission upper level 3. Electrons from the unit laminate structure of the preceding stage are not directly injected into the emission upper level 3 but are injected into the injection level 4 and then relaxed and supplied to the emission upper level 3.

Thereby, the supply efficiency of electrons to the emission upper level 3 can be improved, and operation of the quantum cascade laser 1A with a high output at a high temperature can be realized. Such a subband level structure can be controlled by the design of the quantum well structure in the unit laminate structure constituting the active layer as described later along with a detailed configuration example.

Figure 3:
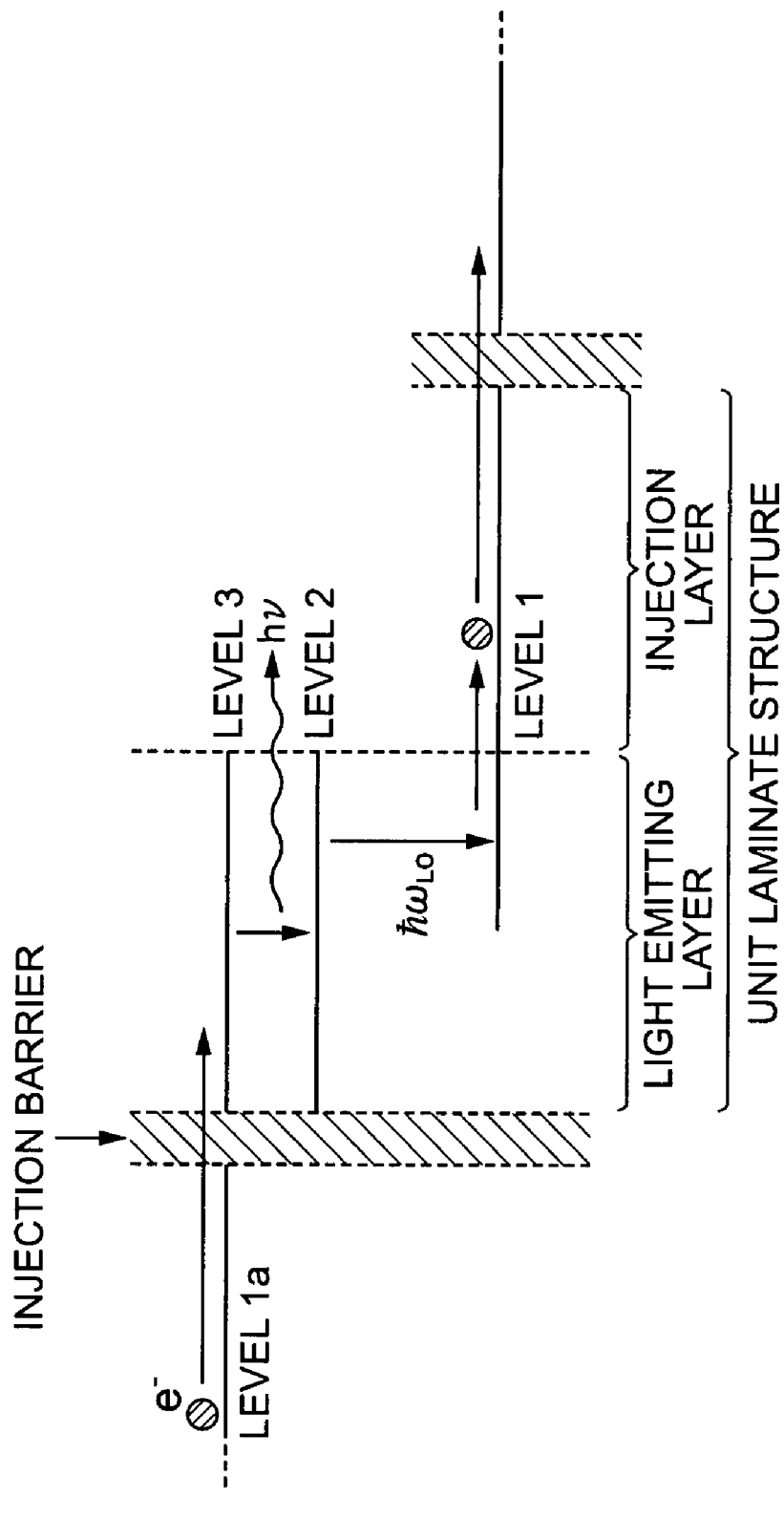
FIG. 3 is a diagram showing a subband level structure in an active layer of a conventional quantum cascade laser.

The laser performance improvement due to the above-described subband level structure will be described in detail while comparing it with a conventional structure. FIG. 3 is a diagram showing a subband level structure in an active layer of a conventional quantum cascade laser. As shown in FIG. 3, the unit laminate structure constituting the active layer in the conventional quantum cascade laser has an emission upper level 3, an emission lower level 2, and a relaxation level 1 in its subband level structure. In this structure, the emission upper level 3 is set so as to substantially coincide with a predetermined level 1a in the injection layer of the unit laminate structure of the preceding stage.

In this subband level structure, electrons from the level 1a in the injection layer of the preceding stage are injected into the emission upper level 3 due to a resonant tunneling effect via an injection barrier. Then, the electrons supplied to the emission upper level 3 emission-transit to the emission lower level 2, and are relaxed at a high speed to the relaxation level 1 by means of LO phonon scattering.

Herein, the energy difference between the emission lower level 2 and the relaxation level 1 is, for example, $E_{LO}$=36 meV as described above in the case of GaAs. On the other hand, considering a construction which generates a THz wave as light hv, for example, when the emission frequency is set to 3 THz (emission wavelength: 100 μm), the energy difference between the emission upper level 3 and the emission lower level 2 is $E_{32}$=12 meV, and the levels come closer to each other than in the construction which generates light in the mid-infrared region. Even in comparison with energy of LO phonon scattering, $E_{32}$<$E_{LO}$.

In this level structure, electrons from the level 1a of the preceding stage are injected into not only the emission upper level 3 but also the emission lower level 2 that is close to the upper level. Therefore, in the three-level system shown in FIG. 3, it is difficult to selectively inject electrons into the emission upper level 3. This is one of the causes limiting the performance of the quantum cascade laser.

Under the condition of $\hbar\omega_{LO} \gg k_B T$ a resonant tunneling current in the above-described three-level system can be approximately expressed as the following equation (1).

$$J = eN_s \frac{2\Omega^2 \tau_{deph}}{1 + \Delta_{1a3}^2 \tau_{deph}^2 + 4\Omega^2 \tau_{32} \tau_{deph}} \tag{1}$$

Herein,
e: electric charge
$2\hbar\Omega$: anticrossing gap
$\tau_{deph}$: phase relaxation time
$\tau_{32}$: relaxation time from level 3 to level 2
$\hbar\Delta_{1a3}$: detuned energy between level 1a and level 3

The anticrossing gap (anticrossing energy gap) indicates a degree of coupling of two well layers, and it becomes zero when the thickness of a barrier layer between these is set to be infinite, and as the barrier layer becomes thinner, the anticrossing gap becomes larger (coupling becomes stronger).

In the terahertz region, to selectively inject a current into the emission upper level 3 in the three-level system, the anticrossing gap between the emission upper level 3 and the level 1a of the preceding stage must be set to the following degree.

$2\hbar\Omega$~1 meV

As in the report in the above-described Non-patent document 2 (B. S. Williams et al., Appl. Phys. Lett. Vol. 83 (2003), pp. 2124-2126), when the carrier density in the electron injection layer is set to $N_S$=3×10$^{10}$/cm$^2$, and Δ=0 is set in the above-described equation (1), the maximum tunneling current density $J_{max}$ becomes about 0.5 kA/cm$^2$. Such a small maximum value of the injection current into the emission upper level becomes a cause limiting the operation of the quantum cascade laser to operation at a low temperature with a low output. In the above-described configuration, it is impossible to increase a current density by thinning the injection barrier and strengthening wave function coupling.

In addition, for example, in the above-described Non-patent document 2, when the active layer is formed by cascade coupling of a quintuple quantum well structure of GaAs/Al$_{0.15}$Ga$_{0.85}$As, laser operations in a range up to a temperature 77K in a condition that an emission frequency is 2.94 THz and an optical output is 100 μW at an operating temperature 5K have been reported. On the other hand, in this document, in a region with an injection current density larger than 1.4 kA/cm$^2$, the optical output suddenly lowers regardless of the operating temperature. According to the rise in the operating temperature, a threshold current density also rises, so that in a temperature region with a threshold over 1.4 kA/cm$^2$, oscillation is not obtained. This tendency, that is, low-temperature low-output operation being caused by limitation of the current injection is a common problem in existing quantum cascade lasers in the terahertz region.

On the other hand, in the quantum cascade laser having the subband level structure of the four-level system shown in FIG. 2, an injection level 4 is newly provided at a point distant by sufficient energy from the emission upper level 3 and electrons from the level 1a of the preceding stage are injected into the injection level 4. At this time, for example, when assuming that the energy difference between the injection level 4 and the emission upper level 3 is $E_{LO}$=36 meV of LO phonon scattering, even if the barrier layer is thinned and the anticrossing gap between the injection level 4 and the level 1a of the preceding stage is increased to about 10 meV, selective electron injection into the injection level 4 becomes possible, and as a result, sufficient current supply due to the resonant tunneling effect becomes possible. Thereby, a quantum cascade laser 1A capable of realizing operation with a high output at a high temperature is obtained.

Herein, in the quantum cascade laser 1A constructed as described above, as shown in FIG. 2, it is preferable that the unit laminate structure 16 constituting the active layer 15 has a relaxation level 1 as an energy level lower than the emission lower level 2 in the subband level structure, and electrons through intersubband transition are relaxed from the emission lower level 2 to the relaxation level 1 and then injected into the injection level in the unit laminate structure of the subsequent stage. Thus, according to the level structure of the four-level system including the relaxation level 1, the emission lower level 2, the emission upper level 3, and the injection level 4, emitting operation in a cascading manner can be preferably realized in the active layer 15 composed of a plurality of unit laminate structures 16.

In addition, in the unit laminate structure 16, it is preferable that electrons injected into the injection level 4 are supplied to the emission upper level 3 by means of LO phonon scattering. Thereby, as described above, electrons that were injected into the injection level 4 from the unit laminate structure of the preceding stage can be supplied to the emission upper level 3 at a high speed via the LO phonon scattering.

In the configuration having the relaxation level 1 as described above, in the unit laminate structure 16, it is preferable that electrons being at the emission lower level 2 through intersubband transition are relaxed to the relaxation level 1 by means of LO phonon scattering. Thereby, electrons that transited to the emission lower level 2 can be relaxed at a high speed to the relaxation level 1 by means of LO phonon scattering and the inverted population between the level 3 and the level 2 can be preferably formed. Alternatively, in the unit laminate structure 16, electrons at the emission lower level 2 through the intersubband transition may be relaxed to the relaxation level 1 by relaxation in a miniband generated by a superlattice.

It is preferable that unit laminate structure 16 is constructed so that the relaxation time $\tau_{43}$ of electrons from the injection level 4 to the emission upper level 3 is sufficiently shorter than the relaxation time $\tau_{42}$ of electrons from the injection level 4 to the emission lower level 2. Herein, in the subband level structure shown in FIG. 2, the level 3 and the level 2 are close to each other, so that, in addition to electrons which are supplied from the injection level 4 to the emission upper level 3 and contribute to emission transition, there are electrons that directly drop to the emission lower level 2 from the injection level 4. On the other hand, by setting the relaxation times $\tau_{43}$ and $\tau_{42}$ as described above, the effective inverted population between the level 3 and the level 2 can be formed with high efficiency. Such relaxation time setting is realized by adjusting wave function overlaps of the levels.

Figure 4:
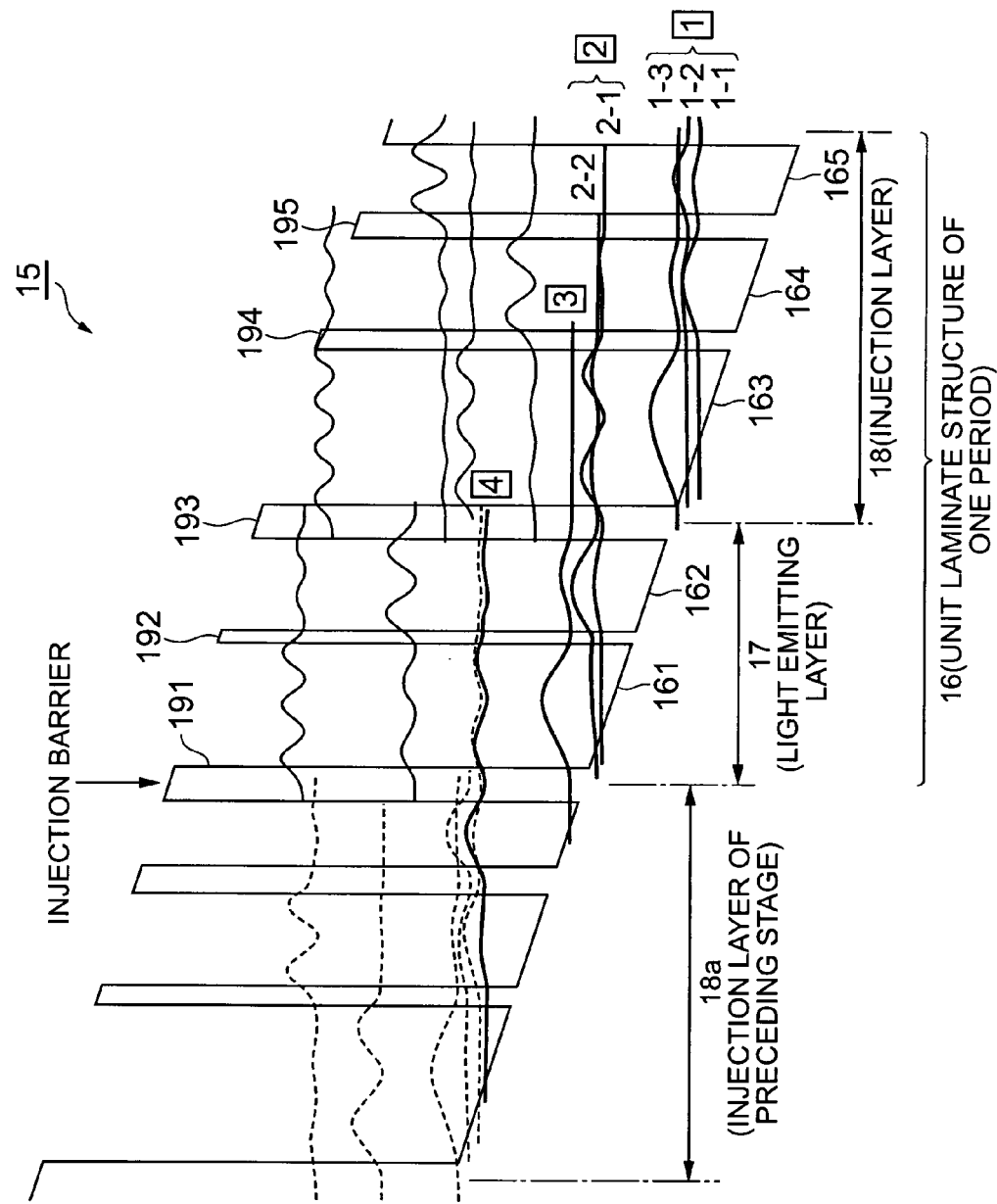
FIG. 4 is a diagram showing an example of a configuration of a unit laminate structure constituting an active layer.

The configuration of the quantum cascade laser of the present invention will be further described by using detailed examples of the quantum well structure in the active layer. FIG. 4 is a diagram showing an example of the configuration of the unit laminate structure constituting the active layer. The quantum well structure of the active layer 15 in this configuration example shows an example designed by setting an emission frequency to 3 THz (emission wavelength: 100 μm, energy: 12 meV) and an operating electric field to 14.5 kV/cm. FIG. 4 shows the quantum well structure and the subband level structure as a part of the multistage repeated structure, formed by the quantum well light emitting layer 17 and the injection layer 18 constituting the active layer 15.

The unit laminate structure 16 of one period in the active layer 15 in this configuration example is formed as a quantum well structure including five quantum well layers 161 to 165 and five quantum barrier layers 191 to 195 which are alternately laminated. Among these semiconductor layers, the well layers 161 to 165 are formed of GaAs layers, respectively. The barrier layers 191 to 195 are formed of $Al_{0.23}Ga_{0.77}As$, respectively.

Herein, concerning the composition of the barrier layer, as shown in FIG. 2, to provide an injection level 4 of an energy higher than the emission upper level 3, by increasing the height of the quantum barrier by increasing the Al composition to 23% from the conventional structure (Non-patent document 2) as described above, the freedom of the design of the level structure is increased. In this case, the height of the barrier is about 200 meV. The thicknesses of these semiconductor layers are 3.5, 14.1, 1.2, 10.1, 3.8, 17.1, 2.0, 10.2, 2.8, and 7.4 (unit: nm), respectively, in the order of the first barrier layer 191, the first well layer 161, ..., the fifth barrier layer 195, and the fifth well layer 165.

In this unit laminate structure 16, the boundary between the quantum well light emitting layer 17 and the injection layer 18 is not always clearly defined, however, the lamination portion including the first well layer 161, the second barrier layer 192, and the second well layer 162 functions mainly as a light emitting layer 17. The lamination portion including the third barrier layer 193, the third well layer 163, the fourth barrier layer 194, the fourth well layer 164, the fifth barrier layer 195, and the fifth well layer 165 functions mainly as an injection layer 18. The first barrier layer 191 serves as an injection barrier for electron injection from the injection layer 18a of the preceding stage.

In this configuration, the unit laminate structure 16 has seven levels of, in descending order of energy, level 4, level 3, level 2-2, level 2-1, level 1-3, level 1-2, and level 1-1 in its subband level structure. Among these, the level 4 and the level 3 correspond to the injection level 4 and the emission upper level 3 shown in FIG. 2, respectively. The two levels of the level 2-2 and level 2-1 are very close to each other as an energy interval less than 3 meV between these, so that they cannot be distinguished, and an emission lower level 2 is set by combining these. Similarly, as for the level 1-3, level 1-2, and level 1-1, a relaxation level 1 is set by combining these.

Designing procedures of the quantum well structure in the unit laminate structure 16 shown in FIG. 4 will be described. First, the well width of the first well layer 161 is set to 14.1 nm so that the energy interval between the level 4 and the level 3 coincides with the energy of LO phonon scattering. Next, to provide a laser emission wavelength, the energy interval between the level 3 and the level 2 relating to emission transition is determined. This energy interval between the level 3 and the level 2 is determined depending on the well widths of the well layers 161 and 162, the thickness of the barrier layer 192, and the operating electric field. The operating electric field is set based on an expected film thickness and voltage drop of the laminate structure per one period.

Herein, when the laser works, as described above, electrons supplied from the injection level 4 are injected into the emission upper level 3 by means of LO phonon scattering, and at the same time, some of the electrons directly drop to the emission lower level 2. Therefore, the level 3 and the level 2 must be designed so that the wave function overlap between the level 4 and the level 3 becomes larger and the wave function overlap between the level 4 and the level 2 becomes smaller. Herein, the laser emission frequency is set to 3 THz, the well width of the second well layer 162 is set to 10.1 nm, the thickness of the second barrier layer 192 is set to 1.2 nm, and the operating electric field is set to 14.5 kV/cm.

The third well layer 163 is a well layer provided for pulling-out electrons at a high speed from the emission lower level 2 into the relaxation level 1. Herein, the well width of the third well layer 163 is set to 17.1 nm so that the energy interval between the level 2 and the level 1 coincides with the energy of LO phonon scattering. The thickness of the third barrier layer 193 is set so that the levels 2-2 and 2-1 become sufficiently close to each other in the operating electric field and occurrence of a level that does not contribute to the laser operation and causes a leak current is prevented. If it is difficult to satisfy these conditions, the operating electric field strength is reset.

Subsequently, the well widths of the well layers 164 and 165 and the thicknesses of the barrier layers 194 and 195 are set. These well widths and thicknesses are set so that electrons are efficiently transported to the light emitting layer in the laminate structure of the subsequent stage in the operating electric field. Last, the thickness of the first barrier layer 191 that becomes an injection barrier is set.

The anticrossing gap is determined depending on the thickness of this barrier layer 191, and therefore, the current density which can be injected from the level 1 of the laminate structure of this period into the level 4 of the next period is determined. Therefore, it is desirable that the coupling between levels is made strong by thinning the barrier layer 191 and making the anticrossing gap large. However, if the barrier layer 191 is excessively thin, the wave function penetration is great and causes a leak current, so that the thickness must be properly adjusted by considering this. In detail, when the thickness of the barrier layer 191 is set to 3.5 nm, the anticrossing gap becomes about 7 meV.

Herein, by taking the quantum well structure of FIG. 4 for instance, the settings of the above-described relaxation times $\tau_{43}$ and $\tau_{42}$ will be described in detail. To make the quantum cascade laser having the subband level structure shown in FIG. 2 effectively work, as described above, it is designed so that the relaxation time $\tau_{43}$ becomes sufficiently shorter than the relaxation time $\tau_{42}$ ($\tau_{43} \ll \tau_{42}$), and electrons injected from the unit laminate structure of the preceding stage into the injection level 4 must be supplied to the emission upper level 3 preferentially over the emission lower level 2. Thus, to design the relaxation times, the wave function overlaps between the levels are adjusted, the wave function overlap between the level 4 and the level 3 is increased, and the wave function overlap between the level 4 and the level 2 is reduced.

On the other hand, when the wave function overlap between the level 4 and the level 3 is increased and the wave function overlap between the level 4 and the level 2 is reduced as described above, the oscillator strength $f_{32}$ of emission transition from the emission upper level 3 to the emission lower level 2 becomes small. That is, when the pump efficiency $\eta$ forming the inverted population is defined as $$\eta = (1/\tau_{43})/\{(1/\tau_{43})+(1/\tau_{42})\}$$

a trade-off relationship is established between the pump efficiency $\eta$ and the oscillator strength $f_{32}$ indicating the strength of emission transition. Therefore, in the configuration of the unit laminate structure 16 constituting the active layer 15, for example, in the thickness combination configuration of the well layers and the barrier layers in the quantum well structure of the unit laminate structure 16, an optimal point exists. When designing the quantum well structure in the active layer 15 of the quantum cascade laser 1A, it is preferable that the structure design is performed by considering the relationship between the pump efficiency $\eta$ and the oscillator strength $f_{32}$.

Figure 5:
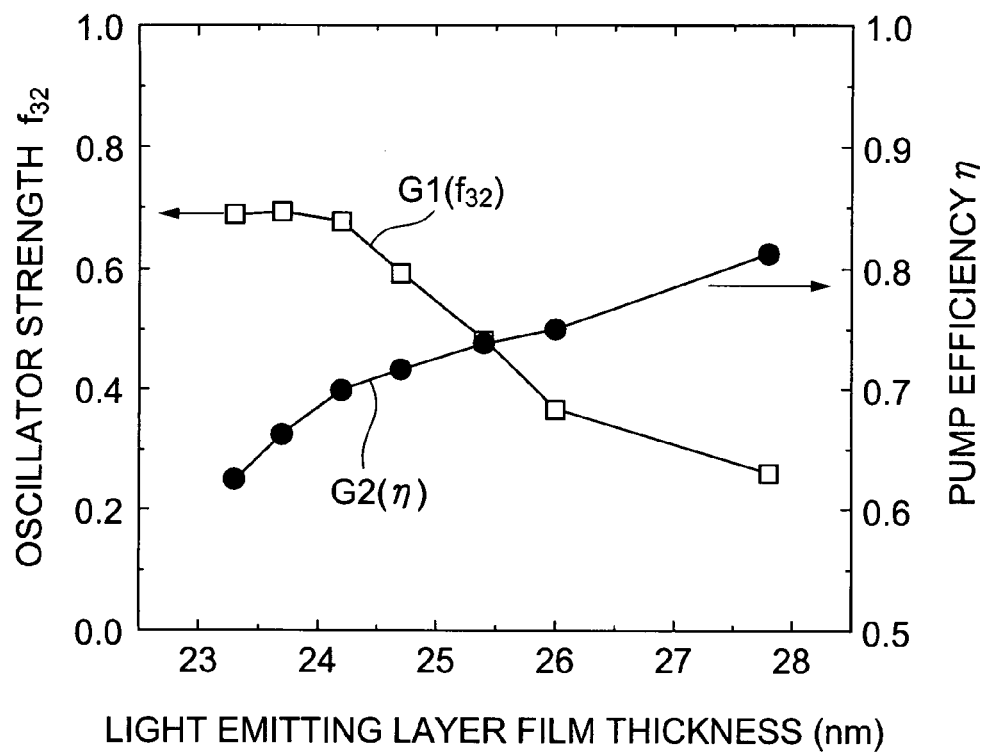
FIG. 5 is a graph showing light emitting layer film thickness dependencies of the oscillator strength $f_{32}$ and pump efficiency η.

FIG. 5 is a graph showing light emitting layer film thickness dependencies of the oscillator strength $f_{32}$ and the pump efficiency $\eta$. Herein, as in the case of the configuration example shown in FIG. 4, the emission frequency is fixed to 3 THz, the operating electric field is fixed to 14.5 kV/cm, and a light emitting layer film thickness that is the total of film thicknesses of three layers of the well layers 161 and 162 and the barrier layer 192 is used as a parameter, whereby changes in oscillator strength $f_{32}$ (graph G1) and pump efficiency $\eta$ (graph G2) are obtained.

From these graphs G1 and G2, it is found that the oscillator strength $f_{32}$ and the pump efficiency $\eta$ have a trade-off relationship. In the configuration example of FIG. 4 described above, the light emitting layer film thickness is set to 25.4 nm, and this film thickness is a thickness (a position where the graphs G1 and G2 cross each other in FIG. 5) which makes the pump efficiency as high as possible and prevents the oscillator strength from becoming excessively small. In this configuration example, the relaxation times $\tau_{43}=0.374$ psec and $\tau_{42}=1.056$ psec, the pump efficiency $\eta=0.74$, and the oscillator strength $f_{32}=0.48$.

Figure 6:
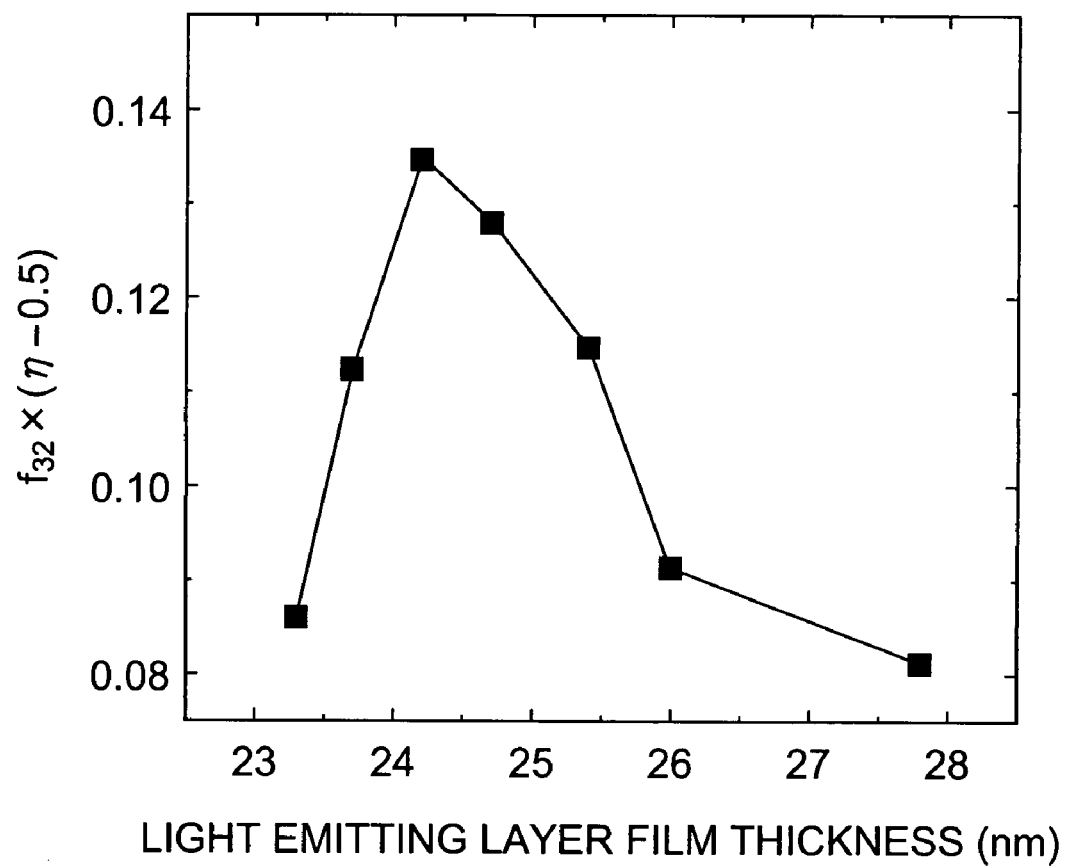
FIG. 6 is a graph showing light emitting layer film thickness dependency of $f_{32} \times (\eta - 0.5)$.

FIG. 6 is a graph showing light emitting layer film thickness dependency of parameter $f_{32} \times (\eta-0.5)$. Herein, as a parameter for obtaining optimal values of the pump efficiency $\eta$, and the oscillator strength $f_{32}$ in the trade-off relationship as described above, $f_{32} \times (\eta-0.5)$ is defined, and changes according to the light emitting layer film thickness are obtained. As to the pump efficiency $\eta$, when $\eta=0.5$, $\tau_{43}$ becomes equal to $\tau_{42}$ and the inverted population is not formed, and therefore, the efficiency $\eta$ not more than 0.5 is meaningless. Therefore, by using a value obtained by subtracting 0.5 from the efficiency $\eta$, the parameter is defined.

In the graph shown in FIG. 6, the graph peaks at the side of the film thickness thinner than the light emitting layer film thickness of 25.4 nm of the configuration example of FIG. 4. This indicates that, in the above-described configuration example, priority is given to the pump efficiency for forming the inverted population important for the laser operation over the emission transition between the level 3 and the level 2. It is preferable that such settings of the light emitting layer film thickness, etc., are properly made according to the detailed construction of each laser element and desired performance, etc.

Figure 7:
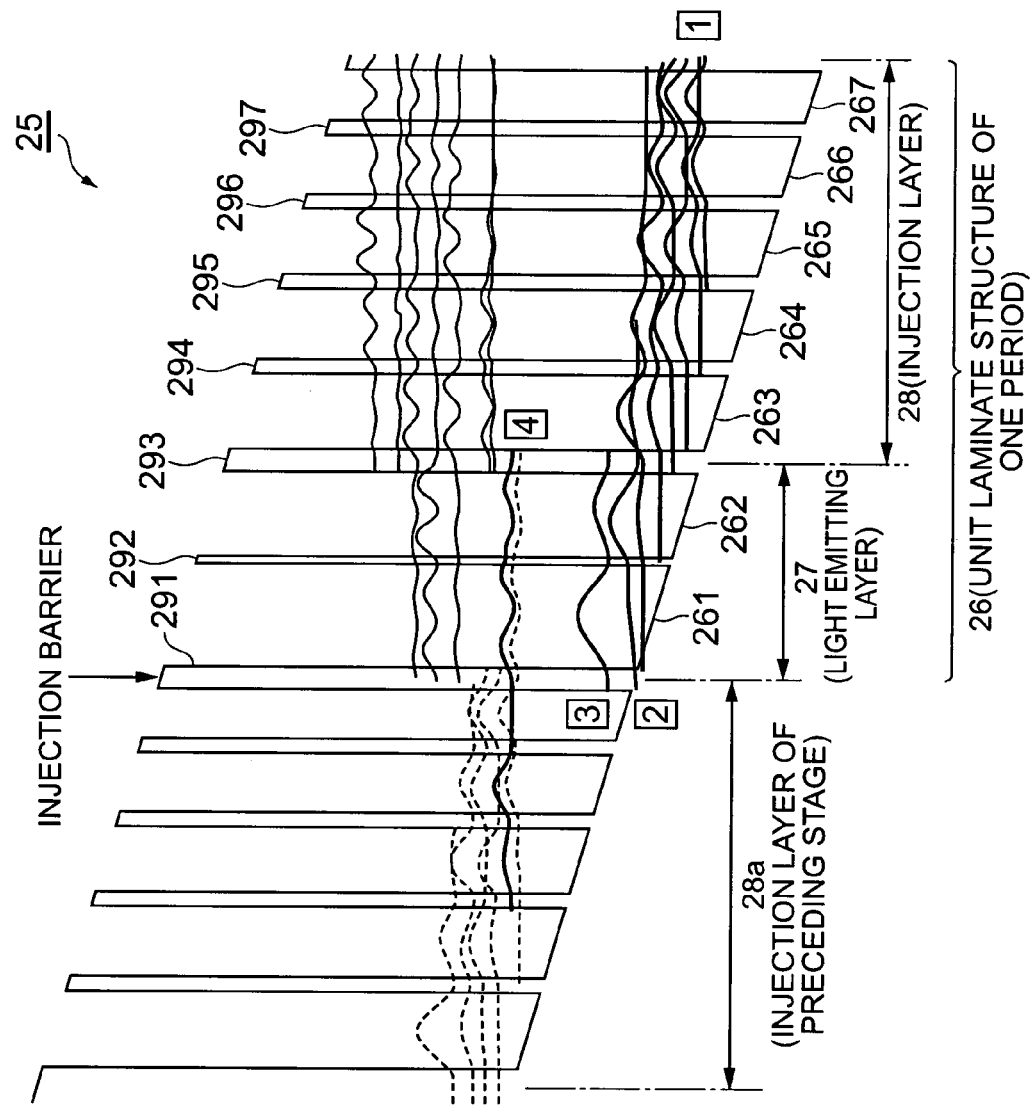
FIG. 7 is a diagram showing another example of the configuration of the unit laminate structure constituting the active layer.

FIG. 7 is a diagram showing another example of the configuration of the unit laminate structure constituting the active layer. The quantum well structure of the active layer 25 in this configuration example is a example designed by setting the emission frequency to 3 THz and the operating electric field to 9.5 kV/cm. FIG. 7 shows the quantum well structure and the subband level structure as a part of the multistage repeated structure, formed by the quantum well light emitting layer 27 and the injection layer 28 constituting the active layer 25.

The unit laminate structure 26 of one period in the active layer 25 in this configuration example is constructed as a quantum well structure formed by alternately laminating seven quantum well layers 261 to 267 and seven quantum barrier layers 291 to 297. Among these semiconductor layers, the well layers 261 to 267 are formed of GaAs layers, respectively. The barrier layers 291 to 297 are formed of $Al_{0.23}Ga_{0.77}As$, respectively.

Herein, the Al composition in the barrier layer is 23% as in the case of the configuration example shown in FIG. 4. The thicknesses of these semiconductor layers are 3.0, 13.8, 0.9, 11.2, 3.0, 10.1, 2.0, 9.2, 2.1, 8.2, 2.3, 7.4, 2.7, and 6.4 (unit:

nm) in the order of the first barrier layer 291, the first well layer 261, . . . , the seventh barrier layer 297, and the seventh well layer 267, respectively.

In this unit laminate structure 26, the lamination portion including the first well layer 261, the second barrier layer 292, and the second well layer 262 functions mainly as the light emitting layer 27. The lamination portion including the third barrier layer 293, the third well layer 263, . . . , the seventh barrier layer 297, and the seventh well layer 267 functions mainly as the injection layer 28. The first barrier layer 291 serves as an injection barrier for electron injection from the injection layer 28a of the preceding stage.

In this configuration, the unit laminate structure 26 has four levels of levels 4, 3, 2, and 1 in descending order of energy in its subband level structure. In this configuration example, as relaxation of electrons from the emission lower level 2 to the relaxation level 1, not relaxation by means of LO phonon scattering but relaxation in a miniband generated by a superlattice is used. In this configuration, transportation control of electrons after emission transition is easy. By using a minigap, it is possible to suppress influences from levels that do not contribute to the laser operation and cause a leak current.

Designing procedures of the quantum well structure in the unit laminate structure 26 shown in FIG. 7 will be described. First, the method for designing the well layers 261 and 262 and the barrier layer 292 is the same as in the configuration example shown in FIG. 4. Concerning the well layers 263 to 267 and the barrier layers 293 to 297, the well widths and thicknesses of these are set so that electrons are efficiently transported to the light emitting layer of the laminate structure of the subsequent stage in the miniband in the operating electric field and leak currents from the levels 2 to 4 are restrained by the mini-gap.

Herein, the total thickness of the quantum well layers and the barrier layers prepared for forming a miniband is reduced as the operating electric field becomes larger, and increases as the operating electric field becomes smaller. In the vicinity of the exit of the miniband in the last well layer 267, to increase the injection efficiency of electrons into the level 4 of the subsequent stage, it is preferable that the energy width of the miniband is made small. In detail, as shown in FIG. 7, the well width of each well layer is set so as to become narrower toward the exit from the entrance of the miniband, and the thickness of each barrier layer is set so as to become thicker toward the exit from the entrance. Preferably, the energy intervals between the levels in the miniband are made smaller than the emission energy to prevent absorption of light. Finally, the thickness of the first barrier layer 291 that serves as an injection barrier is set. In detail, when the thickness of the barrier layer 291 is set to 3.0 nm, the anticrossing gap becomes about 10 meV.

Figure 8:
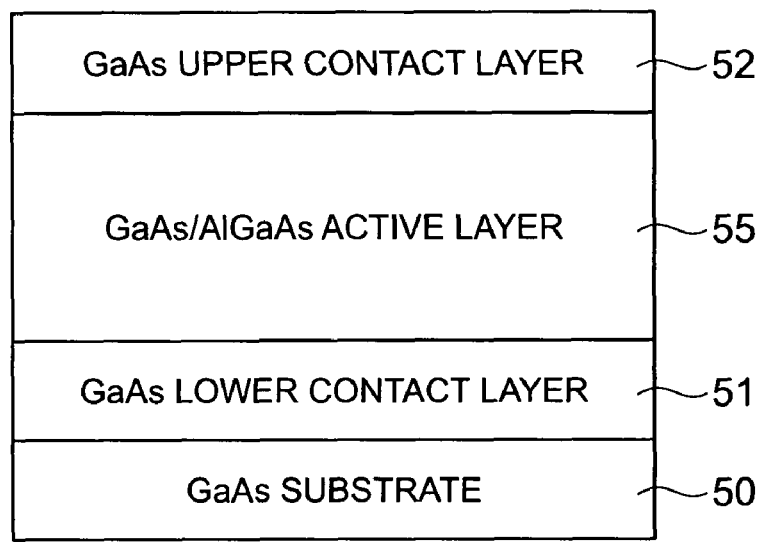
FIG. 8 is a sectional view showing an example of a semiconductor lamination structure to be used for the quantum cascade laser.

A detailed element structure of a quantum cascade laser including an active layer having the subband level structure shown in FIG. 2 will be described along with a detained example thereof. FIG. 8 is a sectional view showing an example of a semiconductor lamination structure to be used for a quantum cascade laser, and FIG. 9 is a sectional side view showing an example of a three-dimensional configuration of a laser.

In the semiconductor lamination structure shown in FIG. 8, according to a solid source MBE method, on a semi-insulating GaAs substrate 50, a lower contact layer 51 (thickness: 800 nm, carrier density: $5\times10^{18}/cm^3$) formed of a high-concentration Si-doped GaAs layer, an active layer 55 formed by laminating unit laminate structures each of which is formed by a light emitting layer and an injection layer of GaAs/$Al_{0.23}Ga_{0.77}As$ in 130 periods, and an upper contact layer 52 (thickness: 60 nm, carrier density: $5\times10^{18}/cm^3$) formed of a high-concentration Si-doped GaAs layer are grown in order. Si is doped at a sheet carrier density of $3\times10^{10}/cm^2$ into the fourth well layer 164 in the configuration example shown in FIG. 4, and into the fifth barrier layer 295, fifth well layer 265, and sixth barrier layer 296 in the configuration example shown in FIG. 7.

By using a normal photolithography technique and etching technique for this semiconductor lamination structure, a ridge stripe type laser element structure is manufactured. The resonator structure of the laser element is formed by means of both-end cleavages. At this time, the rear end face may be coated with a high-reflectivity coating made of Au or the like. As an ohmic electrode, for example, Ti/Au can be used.

Figure 9:
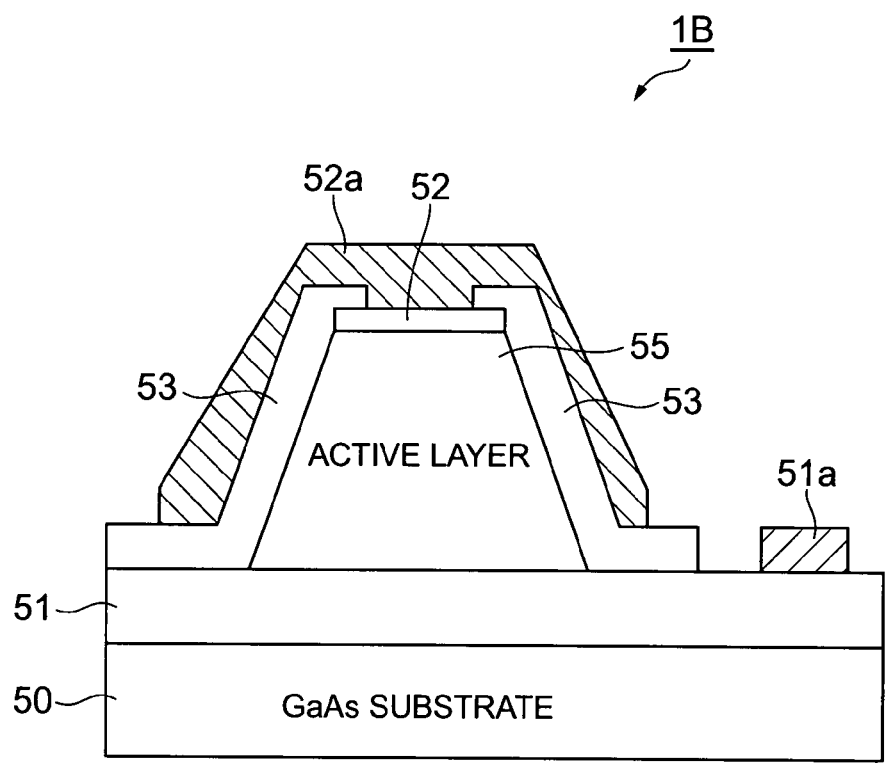
FIG. 9 is a sectional side view showing an example of a three-dimensional configuration of the quantum cascade laser.

As an example of the detailed element structure, as shown in FIG. 9, the lower contact layer 51 formed on the GaAs substrate 50 is exposed by etching, and a lower electrode 51a is formed at a predetermined position. In addition, an insulating film 53 is formed so as to cover the side surfaces of the active layer 55, and an upper electrode 52a is formed on the upper contact layer 52 exposed to the upper side of the active layer 55. Thereby, a quantum cascade laser 1B having the element structure of FIG. 9 is obtained.

The quantum cascade laser of the present invention is not limited to the above-described embodiments and configuration examples, and can be modified in many ways. For example, in the above-described configuration example, for the sake of easiness of element manufacturing, an example in which GaAs substrate is used as the semiconductor substrate and the active laser is made of GaAs/AlGaAs is shown, however, in detail, various configurations can be used as long as the configuration enables emission transition by means of intersubband transition in the quantum well structure and realizes the above-described subband level structure.

For example, for the semiconductor material, other than the above-described GaAs/AlGaAs, various materials such as InGaAs/InAlAs, InAs/AlSb, GaN/AlGaN, and SiGe/Si, etc., can be used. The semiconductor crystal growing method is not limited to the above-described solid source MBE method, and various methods such as a gas source MBE method or an MOCVD method can also be used.

As the semiconductor lamination structure as the whole laser element of the quantum cascade laser, various structures can also be used in addition to the structure shown in FIG. 8. Generally, it is only required that the quantum cascade laser is composed of a semiconductor substrate and an active layer with the above-described configuration provided on the semiconductor substrate. The film thicknesses of the semiconductor layers and doping conditions of the above described configuration examples shown in FIG. 8 and FIG. 9 show examples thereof, and these may be variously changed in detail. The Al composition in the barrier layer to be used in the quantum well structure of the active layer is not limited to the above-described 23%, and may be set to another proportion according to a necessary subband level structure or the like.

Herein, the quantum cascade laser of the above-described embodiment is composed of (1) a semiconductor substrate and (2) an active layer provided on the semiconductor substrate and having a cascade structure formed by alternately laminating quantum well light emitting layers and injection layers by multistage-laminating unit laminate structures each of which includes a quantum well light emitting layer and an injection layer, and (3) each of the plurality of unit laminate structures included in the active layer has, in its subband level structure, an emission upper level, an emission lower level, and an injection level as an energy level higher than the emission upper level, and (4) light is generated by means of intersubband transition of electrons from the emission upper level to the emission lower level in the quantum well light emitting layer, and electrons through the intersubband transition are injected into the injection level in the unit laminate structure of the subsequent stage via the injection layer.

In the quantum cascade laser described above, in the unit laminate structure constituting the active layer, it is preferable that electrons injected into the injection level are supplied from the injection level to the emission upper level by means of longitudinal optical phonon scattering (LO phonon scattering). Thereby, electrons injected from the unit laminate structure of the preceding stage into the injection level are supplied to the emission upper level at a high speed via LO (Longitudinal Optical) phonon scattering. In this case, the energy difference between the injection level and the emission upper level is set according to the energy of LO phonons.

It is preferable that the unit laminate structure is constructed so that the relaxation time of electrons from the injection level to the emission upper level becomes shorter than the relaxation time of electrons from the injection level to the emission lower level. In the above-described subband level structure, in addition to electrons which are supplied from the injection level to the emission upper level, electrons which directly drop from the injection level to the emission lower level also exist. On the other hand, by setting the relaxation times as described above, it becomes possible to form an effective inverted population between the emission upper level and the emission lower level with high efficiency.

It is preferable that the unit laminate structure has, in its subband level structure, a relaxation level as an energy level lower than the emission lower level, and electrons through intersubband transition are relaxed from the emission lower level to the relaxation level and then injected into the injection level of the unit laminate structure of the subsequent stage. Thus, according to the level structure of the four-level system having the relaxation level (level 1), the emission lower level (level 2), the emission upper level (level 3), and the injection level (level 4), cascade emission operation in the active layer including a plurality of unit laminate structures can be preferably realized.

In such a subband level structure, in the unit laminate structure, it is preferable that electrons through intersubband transition are relaxed from the emission lower level to the relaxation level by means of longitudinal optical phonon scattering. Alternatively, in the unit laminate structure, it is preferable that electrons through the intersubband transition are relaxed from the emission lower level to the relaxation level by means of relaxation in a miniband.

The present invention is usable as a quantum cascade laser which can realize operation with a high output at a high temperature.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A quantum cascade laser comprising:
   a semiconductor substrate; and
   an active layer which is provided on the semiconductor substrate and has a cascade structure formed by alternately laminating quantum well light emitting layers and injection layers by multistage-laminating unit laminate structures each of which includes the quantum well light emitting layer and the injection layer, wherein
   each of the plurality of unit laminate structures included in the active layer has an emission upper level, an emission lower level, and an injection level as an energy level higher than the emission upper level in its subband level structure,
   light is generated by intersubband emission transition of electrons from the emission upper level to the emission lower level in the quantum well light emitting layer,
   electrons through the intersubband emission transition transit from the emission lower level to a level in the injection layer, and are injected from the level in the injection layer into the injection level in the quantum well light emitting layer of the subsequent stage due to a resonant tunneling effect via an injection barrier layer provided between the injection layer and the quantum well light emitting layer of the subsequent stage, and
   electrons injected into the injection level through the injection barrier layer are supplied from the injection level to the emission upper level by means of longitudinal optical phonon scattering.

2. The quantum cascade laser according to claim 1, wherein the unit laminate structure is constructed so that a relaxation time of electrons from the injection level to the emission upper level becomes shorter than a relaxation time of electrons from the injection level to the emission lower level.

3. The quantum cascade laser according to claim 1, wherein the unit laminate structure has a relaxation level as an energy level lower than the emission lower level in its subband level structure, and
   electrons through the intersubband emission transition are relaxed from the emission lower level to the relaxation level and then injected into the injection level in the unit laminate structure of the subsequent stage.

4. The quantum cascade laser according to claim 3, wherein in the unit laminate structure, electrons through the intersubband emission transition are relaxed from the emission lower level to the relaxation level by means of longitudinal optical phonon scattering.

5. The quantum cascade laser according to claim 3, wherein in the unit laminate structure, electrons through the intersubband emission transition are relaxed from the emission lower level to the relaxation level by means of relaxation in a miniband.

* * * * *